(12) United States Patent
Tseng et al.

(10) Patent No.: US 10,752,494 B2
(45) Date of Patent: Aug. 25, 2020

(54) SEMICONDUCTOR DEVICE PACKAGE

(71) Applicant: Advanced Semiconductory Engineering, Inc., Kaohsiung (TW)

(72) Inventors: Chi Sheng Tseng, Kaohsiung (TW); Lu-Ming Lai, Kaohsiung (TW); Shih-Chieh Tang, Kaohsiung (TW); Hsin-Ying Ho, Kaohsiung (TW); Hsun-Wei Chan, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/212,609

(22) Filed: Dec. 6, 2018

(65) Prior Publication Data
US 2019/0202686 A1 Jul. 4, 2019

Related U.S. Application Data

(60) Provisional application No. 62/612,138, filed on Dec. 29, 2017.

(51) Int. Cl.
*B81B 7/02* (2006.01)
*H01L 33/60* (2010.01)
*B81B 7/00* (2006.01)
*H01S 5/022* (2006.01)
*H01S 5/00* (2006.01)
*H01S 5/183* (2006.01)

(52) U.S. Cl.
CPC .............. *B81B 7/02* (2013.01); *B81B 7/0067* (2013.01); *H01L 33/60* (2013.01); *H01S 5/02296* (2013.01); *B81B 2201/042* (2013.01); *H01S 5/005* (2013.01); *H01S 5/0071* (2013.01); *H01S 5/183* (2013.01)

(58) Field of Classification Search
CPC ... B81B 7/02; B81B 7/0067; B81B 2201/042; H01S 5/02296; H01S 5/005; H01S 5/183; H01S 5/0071; H01L 33/60
USPC .......................................................... 257/98
See application file for complete search history.

(56) References Cited

U.S. PATENT DOCUMENTS

| 9,354,115 | B2 | 5/2016 | Darty | |
|---|---|---|---|---|
| 9,690,092 | B2* | 6/2017 | Freedman | G01B 11/254 |
| 2008/0298649 | A1* | 12/2008 | Ennis | G06K 9/00046 |
| | | | | 382/125 |
| 2018/0204038 | A1* | 7/2018 | Hung | G02B 19/0014 |
| 2019/0044723 | A1* | 2/2019 | Prakash | H04L 9/3247 |

* cited by examiner

*Primary Examiner* — Fernando L Toledo
*Assistant Examiner* — Adam S Bowen
(74) *Attorney, Agent, or Firm* — Foley & Lardner LLP

(57) ABSTRACT

A semiconductor device package is provided, which includes a carrier, a first reflective element, a second reflective element, a first optical component, a second optical component and a microelectromechanical system (MEMS) device. The carrier has a first surface. The first reflective element is disposed on the first surface of the carrier. The second reflective element disposed on the first surface of the carrier. The first optical component is disposed on the first reflective element. The second optical component is disposed on the second reflective element. The MEMS device is disposed on the first surface of the carrier to provide light beams to the first reflective element and the second reflective element. The light beams provided to the first reflective element are reflected to the first optical component and the light beams provided to the second reflective element are reflected to the second optical component.

27 Claims, 14 Drawing Sheets

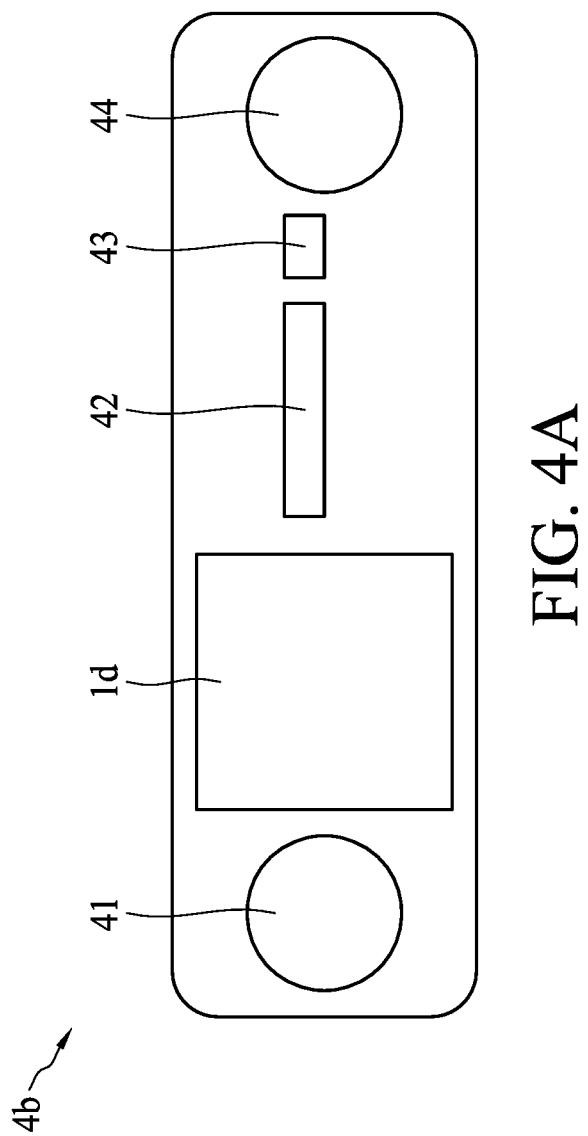

SEMICONDUCTOR DEVICE PACKAGE

CROSS-REFERENCE TO RELATED APPLICATIONS

This application claims the benefit of and priority to U.S. Provisional Application No. 62/612,138, filed Dec. 29, 2017, the contents of which are incorporated herein by reference in their entirety.

BACKGROUND

1. Technical Field

The subject application relates generally to a semiconductor device package. More particularly, the subject application relates to a semiconductor device package including an optical module and another optical module.

2. Description of the Related Art

Biometric security is a security mechanism used to authenticate and provide access to an electronic device, a facility or a system based on the automatic and instant verification of an individual's physical characteristics. A biometric security-based device, module, system, facility or engine stores human body characteristics that do not change over an individual's lifetime. These include fingerprints, eye texture, voice, hand patterns, facial recognition, and so forth.

An individual's body characteristics are pre-stored in a biometric security system, module or scanner, which may be accessed by authorized personnel. When an individual walks into a facility or comes adjacent to or tries to gain access to an electronic device, a facility or a system, the biometric security-based system or module evaluates his/her physical characteristics, which are matched with stored records. If a match is located, the individual is granted access. If not, access is denied.

SUMMARY

Some embodiments of the subject application provides a semiconductor device package, which includes a carrier, a first reflective element, a second reflective element, a first optical component, a second optical component and a microelectromechanical system (MEMS) device. The carrier has a first surface. The first reflective element is disposed on the first surface of the carrier. The second reflective element disposed on the first surface of the carrier. The first optical component is disposed on the first reflective element. The second optical component is disposed on the second reflective element. The MEMS device is disposed on the first surface of the carrier to provide light beams to the first reflective element and the second reflective element. The light beams provided to the first reflective element are reflected to the first optical component and the light beams provided to the second reflective element are reflected to the second optical component.

Some embodiments of the subject application provides a semiconductor device package, which includes a carrier, a three-dimensional structured light component, a non-structured light component and a microelectromechanical system (MEMS) device. The carrier has a first surface. The three-dimensional structured light component is disposed on the carrier. The non-structured light component is disposed on the carrier. The MEMS device is disposed on the first surface of the carrier to provide light beams to the three-dimensional structured light component and the non-structured light component.

BRIEF DESCRIPTION OF THE DRAWINGS

Aspects of the subject application are best understood from the following detailed description when read with the accompanying drawings. It is noted that various features may not be drawn to scale, and the dimensions of the various features may be arbitrarily increased or reduced for clarity of discussion.

FIG. 4A illustrates a biometric security-based module in accordance with some embodiments of the subject application.

Common reference numerals are used throughout the drawings and the detailed description to indicate the same or similar elements. The subject application will be more apparent from the following detailed description taken in conjunction with the accompanying drawings.

DETAILED DESCRIPTION

Figure 1A:
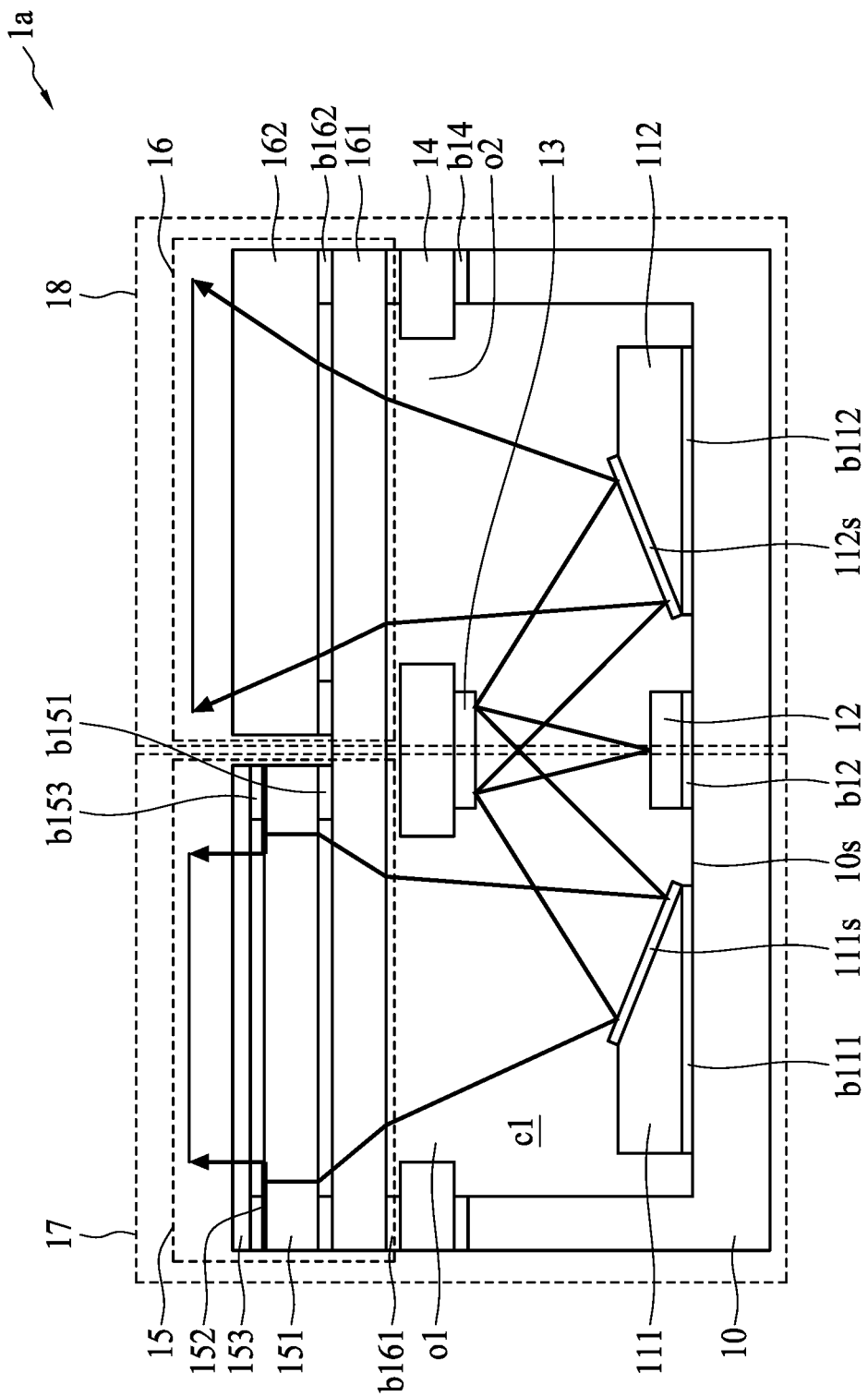
FIG. 1A illustrates a cross-sectional view of the semiconductor device package in accordance with some embodiments of the subject application.

Manufacturing and use of the embodiments of the subject application are discussed in detail below. It should be appreciated, however, that the embodiments set forth many applicable concepts that can be embodied in a wide variety of specific contexts. It is to be understood that the following disclosure provides many different embodiments or examples of implementing different features of various embodiments. Specific examples of components and arrangements are described below for purposes of discussion. These are, of course, merely examples and are not intended to be limiting.

Embodiments, or examples, illustrated in the figures are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the subject application may repeat reference numerals and/or letters in the various examples. This repetition is for the purpose of simplicity and clarity and does not in itself dictate a relationship between the various embodiments and/or configurations discussed.

FIG. 1A illustrates a cross-sectional view of the semiconductor device package 1a in accordance with some embodiments of the subject application.

The semiconductor device package 1a includes a carrier 10, reflective components 111 and 112, layers 111s and 112s, an emitter 12, a micro-electromechanical systems (MEMS) device 13, a lid 14, a collimator 151, a mask layer 152, an optical element 153, diffusers 161 and 162, bonding materials b111, b112, b12, b14, b161, b162, b151 and b153.

The semiconductor device package 1a includes an optical module 17. The semiconductor device package 1a includes another optical module 18. The semiconductor device package 1a includes an optical module 15. The semiconductor device package 1a includes an optical module 16.

The optical module 17 may include the carrier 10, the reflective component 111, the layer 111s, the emitter 12, the MEMS device 13, the lid 14 (which defines the opening o1) and the optical module 15.

The optical module 18 may include the carrier 10, the reflective component 112, the layer 112s, the emitter 12, the MEMS device 13, the lid 14 (which defines the opening o2) and the optical module 16.

The carrier 10 may include circuitry (not illustrated in FIG. 1A) therein and/or thereon. The carrier 10 may include conductive traces (not illustrated in FIG. 1A). The carrier 10 may include conductive pads (not illustrated in FIG. 1A). The carrier 10 may include conductive vias (not illustrated in FIG. 1A). The carrier 10 may include semiconductor material. The carrier 10 may include conductive material. The carrier 10 may include insulation material (e.g. dielectric material). The carrier 10 may include redistribution (RDL) structure(s). The carrier 10 may include ceramic, bismaleimide triazine (BT), FR4, prepreg (PP) or other suitable materials. The carrier 10 may include opaque material.

The carrier 10 defines a cavity c1 to accommodate or receive the emitter 12, the bonding materials b12 and b14, the reflective components 111 and 112, and the MEMS device 13. The carrier 10, which includes ceramic material, provides a relatively stiff or rigid structure to mitigate warpage. The carrier 10, which includes ceramic material, provides a relatively smooth, flat or even surface.

The lid 14 is disposed on the carrier 10. The lid 14 is attached or bonded to the carrier 10 by the bonding material b14. The bonding material b14 may include solder material, conductive adhesive (film type or gel type), non-conductive adhesive (film type or gel type) or other suitable materials.

The lid 14 defines an opening o1 and another opening o2. The opening o1 is arranged over the carrier 10. The opening o2 is arranged over the carrier 10. The opening o1 is adjacent to the opening o2.

The lid 14 may include circuitry (not illustrated in FIG. 1A) therein and/or thereon. The lid 14 may include conductive traces (not illustrated in FIG. 1A). The lid 14 may include conductive pads (not illustrated in FIG. 1A). The lid 14 may include conductive vias (not illustrated in FIG. 1A). The lid 14 may include semiconductor material. The lid 14 may include conductive material. The lid 14 may include insulation material (e.g. dielectric material). The lid 14 may include opaque material. The lid 14 may include a redistribution (RDL) structure(s). The lid 14 may include ceramic, metal, plastic, glass, polymer or other suitable materials.

The emitter 12 is disposed on the carrier 10. The emitter 12 is disposed on a surface 10s of the carrier 10. The emitter 12 is supported by the carrier 10. The emitter 12 is electrically connected to the carrier 10. The emitter 12 is disposed in the cavity c1 defined by the carrier 10. The emitter 12 may include, a light emitter (e.g. a light-emitting diode (LED) die), a laser diode/die (e.g. a vertical-cavity surface-emitting laser (VCSEL) die)/chip, etc. The emitter 12 may have a rise and fall time at a nano-second (ns) level. The emitter 12 may include a light source which radiates invisible light or light beams to a certain camera. For example, the emitter 12 may emit infrared light, ultraviolet light, or the like.

The emitter 12 is attached or bonded to the carrier 10 by the bonding material b12. The bonding material b12 may include solder material, pre-solder material, conductive adhesive material (film type or gel type), etc.

In some embodiments, the emitter 12 may include a patterned mask (not illustrated in FIG. 1A) is disposed on an active side of the emitter 12. The patterned mask may define an array of openings such that light emitted from the active side of the emitter 12 may pass through the array of openings of the patterned mask. The emitter 12 may function as an array of light sources. The emitter 12 may include a single chip having an array of micro laser emitters (e.g. an array of VCSEL dies). The emitter 12 may include a single chip having a number (e.g. ten to thousands) of micro laser emitters.

In some embodiments of the subject application, for example, a pre-solder material b12, which may at least include gold (Au) and tin (Sn), is formed on the carrier 10 or the emitter 12. Subsequent to placing the emitter 12 to the carrier 10 (e.g. by a pick-and-place technique), a heating operation may be performed on the bonding material b12 (e.g. by a laser technique). The pre-solder material b12, which include Au and Sn, provides a relatively even thickness. The pre-solder material b12, which include Au and Sn, is relatively thin.

The MEMS device 13 is attached or bonded to the lid 14. The MEMS device 13 is disposed over the carrier 10. The MEMS device 13 is disposed over the emitter 12. The MEMS device 13 is disposed under the lid 14. The MEMS device 13 is adjacent to the opening o1. The MEMS device 13 is adjacent to the opening o2. The MEMS device 13 is adjacent to the openings o1 and o2. The MEMS device 13 is disposed between the openings o1 and o2. The MEMS device 13 is disposed on the emitter 12 such that light emitted from the emitter 12 can arrive or reach the MEMS device 13.

In some embodiments, the MEMS device 13 may be an MEMS scanning mirror, an MEMS scanning mirror die or an MEMS scanner, which tilts to allow high speed, fully controlled, non-resonant and resonant beam steering. The MEMS device 13 may be actuated by ultra-low current analog voltage input. The MEMS device 13 may arbitrarily deflect or reflect light beams. The MEMS device 13 may be operated at frequencies from approximately 0.1 kHz to approximately 50 kHz.

The reflective component 111 may be attached or bonded to the carrier 10 by the bonding materials b111. The bonding material b111 is similar to the bonding material b14. The bonding material b111 is same to the bonding material b14. The bonding material b111 is different from the bonding material b14.

The reflective component 111 may include a layer 111s. The reflective component 111 may include reflective material. The reflective component 111 may include non-reflective material. The reflective component 111 may include silicon, glass or other suitable materials. The layer 111s includes reflective material. The layer 111s may include Au, Ag or other reflective material.

The layer 111s is disposed or formed on the reflective component 111. The layer 111s is formed on the reflective component 111 by coating, plating, deposition, sputtering or other suitable techniques. The layer 111s is disposed or formed on the inclined surface/plane of the reflective component 111. The layer 111s is disposed or formed on the slope of the reflective component 111.

Light beams from the emitter 12 are emitted to the MEMS device 13. The MEMS device 13 directs the light beams from the emitter 12 to the reflective components 111. The reflective component 111 reflects the reflected light beams to the opening o1. The reflective component 111 directs the reflected light beams to the optical module 15. The layer 111s reflects the reflected light beams to the opening o1. The layer 111s directs the reflected light beams to the optical module 15.

The reflective component 112 may be attached or bonded to the carrier 10 by the bonding materials b112. The bonding material b112 is similar to the bonding material b14. The bonding material b112 is same to the bonding material b14. The bonding material b112 is different from the bonding material b14.

The reflective component 112 may include the layer 112s. The reflective component 112 may include reflective material. The reflective component 112 may include non-reflective material. The reflective component 112 may include silicon, glass or other suitable materials. The layer 112s includes reflective material. The layer 112s may include Au, Ag or other reflective material.

The layer 112s is disposed or formed on the reflective component 112. The layer 112s is formed on the reflective component 112 by a coating, plating, deposition, sputtering or other suitable techniques. The layer 112s is disposed or formed on the inclined surface/plane of the reflective component 112. The layer 112s is disposed or formed on the slope of the reflective component 112.

Light beams from the emitter 12 are emitted to the MEMS device 13. The MEMS device 13 directs the light beams from the emitter 12 to the reflective components 112. The reflective component 112 reflects the reflected light beams to the opening o2. The reflective component 112 directs the reflected light beams to the optical module 16. The layer 112s reflects the reflected light beams to the opening o2. The layer 112s directs the reflected light beams to the optical module 16.

In some embodiments, the reflective components 111 and 112 may include a base structure formed in one piece. That is, the reflective components 111 and 112 may be two portions of the base structure. The base structure of the reflective components 111 and 112 may include a ring or annular structure. The base structure of the reflective components 111 and 112 may surround the emitter 12.

In some embodiments, the reflective components 111 and 112 may be formed in separate/individual base structures. The reflective component 111 may include an inclined surface/plane facing the emitter 12. The reflective component 111 may include a slope facing the emitter 12. The reflective component 112 may include an inclined surface/plane facing the emitter 12. The reflective component 112 may include a slope facing the emitter 12. The inclined surface/plane or slope of the reflective component 111 may reflect light beams from the MEMS device 13 to pass through the opening o1. The inclined surface/plane or slope of the reflective component 112 may reflect light from the MEMS device 13 to pass through the opening o2.

It is contemplated that the reflective component 111 may be omitted or eliminated in accordance with some other embodiments of the subject application. Furthermore, it is contemplated that the reflective component 112 may be omitted or eliminated in accordance with some other embodiments of the subject application.

The optical module 15 includes the diffuser 161, the collimator 151, the mask layer 152 and the optical element 153.

The diffuser 161 is disposed on the lid 14. The diffuser 161 is attached or bonded to the lid 14 by the bonding material b161. The bonding material b161 is similar to the bonding material b14. The bonding material b161 is the same as the bonding material b14. The bonding material b161 is different from the bonding material b14.

The diffuser 161 is disposed over the opening o1. The diffuser 161 is disposed over the opening o2. Light beams which pass through the opening o1 may be diffused, spread out or scattered by the diffuser 161. Light beams which pass through the opening o2 may be diffused, spread out or scattered by the diffuser 161.

The collimator 151 is disposed on the diffuser 161. The collimator 151 is attached or bonded to the diffuser 161 by the bonding material b151. The bonding material b151 is similar to the bonding material b14. The bonding material b151 is the same as the bonding material b14. The bonding material b151 is different from the bonding material b14.

The collimator 151 is disposed over the opening o1. Light beams which pass through the opening o1 and the diffuser 161 may be collimated by the collimator 151.

In some embodiments, the collimator 151 has a regular pattern of holes. For example, the holes may be arranged in a single-row, or in a square, or a rectangular and staggered pattern, etc. Therefore, light dots (or an array of light dots) may be emitted in the pattern after light beams pass through the collimator 151.

The mask layer 152 is disposed or formed on the collimator 151. The mask layer 152 is disposed or formed on the periphery of the collimator 151. The mask layer 152 includes material to absorb or block light. Light cannot pass through the mask layer. The mask layer 152 may facilitate the collimated light beams (from the collimator 151) entering a function area (not denoted in FIG. 1A) of the optical element 153. The mask layer 152 may block or prevent the collimated light beams (from the collimator 151) from entering an area (other than the function area) of the optical element 153. It is contemplated that the mask layer 152 may also be disposed or formed on the optical element 153 in accordance with some other embodiments of the subject application. On the other hand, it is contemplated that the mask layer 152 may be eliminated or omitted in accordance with some other embodiments of the subject application. Assembly tolerance or deviation may be compensated by the mask layer 152.

The optical element 153 may include a diffractive optical element (DOE). The optical element 153 may function as a multi-spot beam splitter in beam shaping or beam profile modification. Light beams which pass through the optical element 153 may be split, shaped or modified into a number of spots or dots.

The optical element 153 is disposed on the collimator 151. The optical element 153 is attached or bonded to the collimator 151 by the bonding material b153. The bonding material b153 is similar to the bonding material b14. The bonding material b153 is the same as the bonding material b14. The bonding material b153 is different from the bonding material b14.

The optical element 153 is disposed over the opening o1. Light beams which pass through the opening o1 and the collimator 151 may pass through the optical element 153. The light beams which pass through the optical element 153 may be split, shaped or modified by the optical element 153.

The optical module 16 includes the diffusers 161 and 162. The diffuser 162 is disposed on the diffuser 161. The diffuser 162 is attached or bonded to the diffuser 161 by the bonding material b162. The bonding material b162 is similar to the bonding material b14. The bonding material b162 is the same as the bonding material b14. The bonding material b162 is different from the bonding material b14.

An upper surface of the optical element 153 may be substantially and elevationally the same as an upper surface of the diffuser 162. An upper surface of the optical element 153 may be elevationally different from an upper surface of the diffuser 162.

The diffuser 162 is disposed over the opening o2. Light beams which pass through the opening o2 and the diffuser 161 may be diffused, spread out or scattered by the diffuser 162.

The optical module 17 may function as a dot projector. For example, when light beams emitted from the emitter 12 are reflected or deflected by the MEMS device 13, the light beams reflected or deflected by the MEMS device 13, which arrive at or reach the reflective component 111 or the layer 111s, are reflected by the reflective component 111 or the layer 111s to pass through the opening o1; the light beams which pass through the opening o1 may then pass through the diffuser 161; the light beams which pass through the diffuser 161 may then pass through the collimator 151; the light beams which pass through the collimator 151 may enter and pass through the optical element 153 to form a number of light dots or a light pattern.

The optical module 18 may function as a flood illuminator. For example, when light beams emitted from the emitter 12 are reflected or deflected by the MEMS device 13, the light beams reflected or deflected by the MEMS device 13, which arrive at or reach the reflective component 112 or the layer 112s, are reflected by the reflective component 112 or the layer 112s to pass through the opening o2; the light beams which pass through the opening o2 may then pass through the diffusers 161 and 162; the light beams which pass through the diffusers 161 and 162 are diffused, spread out or scattered by the diffusers 161 and 162.

The semiconductor device package 1a includes a dot projector 17. The semiconductor device package 1a includes a flood illuminator 18. The dot projector 17 includes an optical module 15. The flood illuminator 18 includes an optical module 16. The dot projector 17 and the flood illuminator 18 are integrated into the semiconductor device package 1a, and therefore the semiconductor device package 1a may have a relatively small size. The semiconductor device package 1a, which includes one light source (e.g. the emitter 12), may allow for relatively less power and less space.

It is contemplated that the semiconductor device package 1a may be integrated into a biometric security-based module to identify biometric features of a user. The biometric security-based module may include a camera, a semiconductor device package 1a and a proximity sensor. Therefore, the surface area or occupied area of the biometric security-based module which includes the semiconductor device package 1a may be reduced. If the biometric security-based module is used in an electronic device, the surface or occupied area reduction of the biometric security-based module may facilitate the miniaturization of the electronic device, saving more display/function area on the screen or creating more space for circuit design.

In an operation when the semiconductor device package 1a is integrated into the biometric security-based module, the semiconductor device package 1a will be turned on or activated once the proximity sensor of the biometric security-based module detects or receives optical signals. The flood illuminator 18 of the optical module 16 of the semiconductor device 1a may be activated. The MEMS device 13 is controlled to direct light beams to the reflective component 112. Light beams are reflected by the reflective component 112 and pass through the opening o2. Once images of the user taken by the camera of the biometric security-based module are determined to include facial features, the dot projector 17 of the semiconductor device package 1a may be activated. The MEMS device 13 is controlled to direct light beams to the reflective component 111. Light beams are reflected by the reflective component 111 and pass through the opening o1. Multiple light dots (or structured light) are outputted after light beams pass through the dot projector 17. In some embodiments, light dots outputted by the optical module 17 are structured light, which may be utilized for facilitating facial recognition. If images of the user taken by the camera of the biometric security-based module are matched with stored records, the user may be identified by the biometric security-based module. The MEMS device 13 may keep working (e.g. alternately activate the flood illuminator 18 and the dot projector 17) during the operation discussed above. The MEMS device 13 may keep alternately directing light beam(s) to the reflective component 111 and the reflective component 112 during the operation discussed above.

In another operation when the semiconductor device package 1a is integrated into the biometric security-based module, the images taken by the camera may be further utilized for determining default/reference parameters (e.g. a tilt/rotation angle of the MEMS device 13) of the semiconductor device package 1a. For example, the default/reference parameters may be used to control the MEMS device 13 to compensate for assembly deviation/tolerance of the semiconductor device package 1a. The default/reference parameters may be used to control the MEMS device 13 to facilitate calibration under certain circumstances.

Figure 1C:
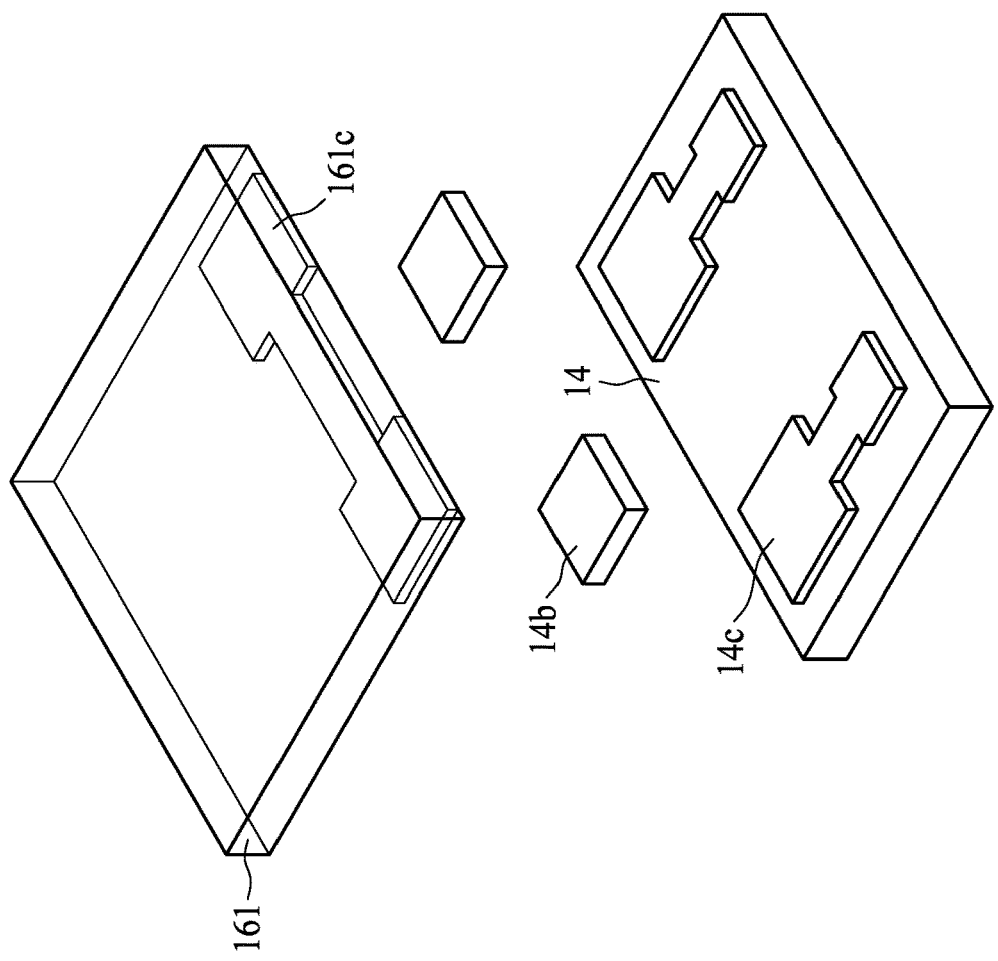
FIG. 1C illustrates an explosive view of a portion of a semiconductor device package in accordance with some embodiments of the subject application.
Figure 1B:
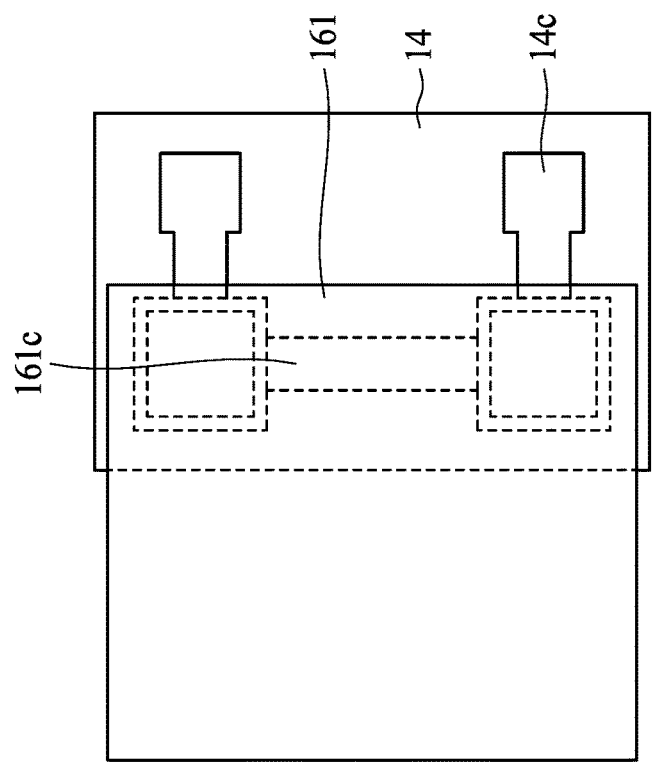
FIG. 1B illustrates a top view of a portion of a semiconductor device package in accordance with some embodiments of the subject application.

FIG. 1B is a top view of a portion of the semiconductor device package 1a in accordance with some embodiments of the subject application. Referring to FIG. 1B, the diffuser 161 is disposed on the lid 14. A patterned conductive layer 161c is disposed or formed on a lower surface of the diffuser 161. A patterned conductive layer 14c is disposed or formed on an upper surface of the lid 14. After attaching or bonding the diffuser 161 to the lid 14, the patterned conductive layer 161c is in contact with the patterned conductive layer 14c. After attaching or bonding the diffuser 161 to the lid 14, the patterned conductive layer 161c is electrically connected to the patterned conductive layer 14c.

Although not illustrated, it is contemplated that the patterned conductive layer 161c may be electrically connected to the emitter 12. Although not illustrated, it is contemplated that the patterned conductive layer 161c may be electrically connected to a control circuit (not illustrated in FIG. 1B) which controls the semiconductor device package 1a. Once the electrical connection between the patterned conductive layer 161c and the patterned conductive layer 14c (or the electrical connection between the patterned conductive layer 161c and the control circuit) is broken or disconnected, the emitter 12 will be deactivated or turned off. One of the advantages of the arrangement shown in FIG. 1B is to prevent the light beams from directly entering a human eye(s) while the diffuser 161 is separated from the lid 14.

Although not illustrated, it is contemplated that circuitry similar to the patterned conductive layer 161c and the patterned conductive layer 14c may be formed between the carrier 10 and the lid 14. Although not illustrated, it is contemplated that circuitry similar to the patterned conductive layer 161c and the patterned conductive layer 14c may be formed between the diffuser 161 and the diffuser 162. Although not illustrated, it is contemplated that circuitry similar to the patterned conductive layer 161c and the patterned conductive layer 14c may be formed between the diffuser 161 and the collimator 151. Although not illustrated, it is contemplated that circuitry similar to the patterned conductive layer 161c and the patterned conductive layer 14c may be formed between the collimator 151 and the optical element 16.

FIG. 1C illustrates an explosive view of a portion of the semiconductor device package 1a in accordance with some embodiments of the subject application. Referring to FIG. 1C, the patterned conductive layer 161c and the patterned conductive layer 14c are bonded by the bonding material 14b.

Figure 1E:
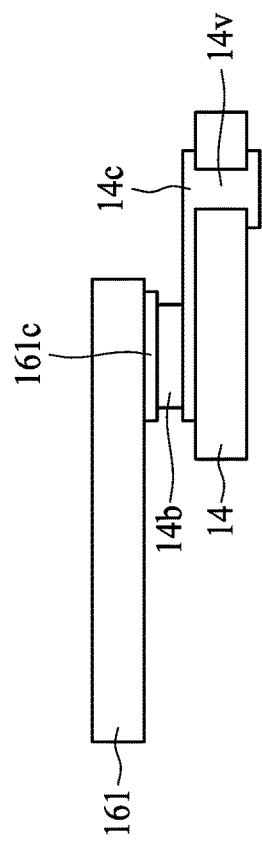
FIG. 1E illustrates a cross-sectional view of a portion of a semiconductor device package in accordance with some embodiments of the subject application.
Figure 1D:
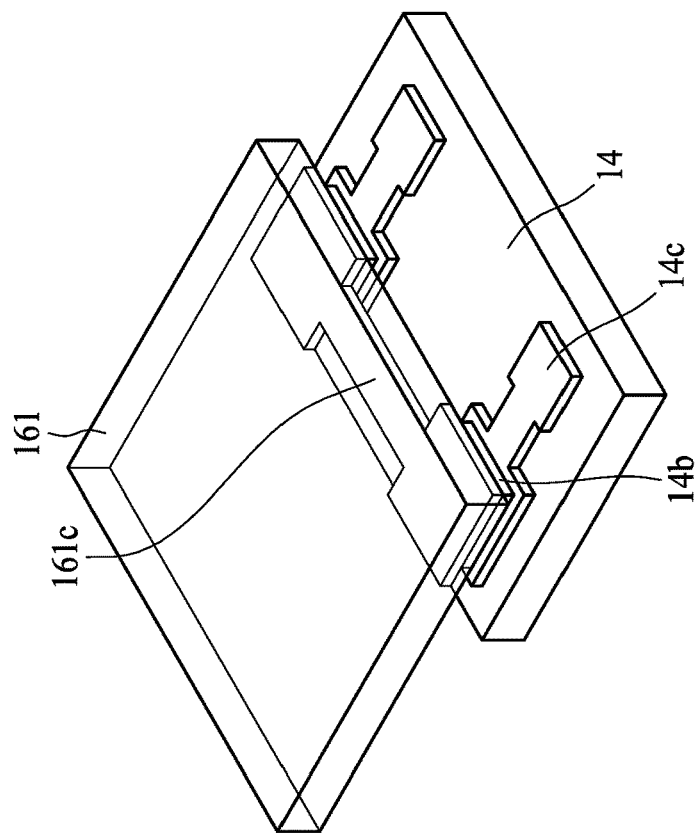
FIG. 1D illustrates a perspective view of a portion of a semiconductor device package in accordance with some embodiments of the subject application.

FIG. 1D illustrates a perspective view of a portion of the semiconductor device package 1a in accordance with some embodiments of the subject application.

FIG. 1E illustrates a cross-sectional view of a portion of the semiconductor device package 1a in accordance with some embodiments of the subject application. Referring to FIG. 1E, the lid 14 may include a conductive through-via 14v for electrical connection to the carrier 10.

Figure 2A:
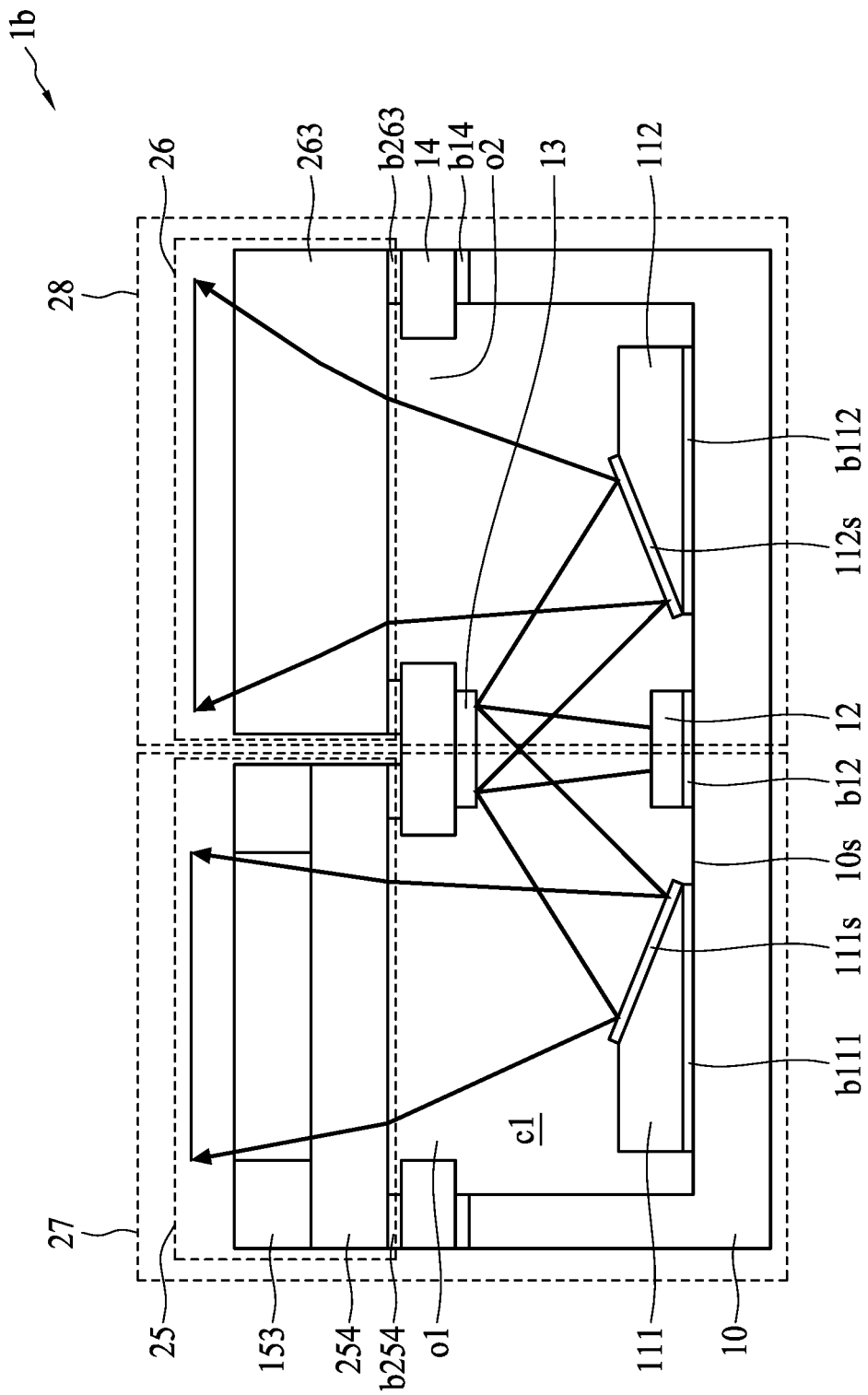
FIG. 2A illustrates a cross-sectional view of a semiconductor device package in accordance with some embodiments of the subject application.

FIG. 2A illustrates a cross-sectional view of a semiconductor device package 1b in accordance with some embodiments of the subject application. The semiconductor device package 1b is similar to the semiconductor device package 1a. The optical module 17 of the semiconductor device package 1a is replaced by the optical module 27. The optical module 18 of the semiconductor device package 1a is replaced by the optical module 28. The optical module 15 of the semiconductor device package 1a is replaced by the optical module 25. The optical module 16 of the semiconductor device package 1a is replaced by the optical module 26.

The optical module 27 may include the carrier 10, the reflective component 111, the layer 111s, the emitter 12, the MEMS device 13, the lid 14 (which defines the opening o1), and the optical module 25.

The optical module 28 may include the carrier 10, the reflective component 112, the layer 112s, the emitter 12, the MEMS device 13, the lid 14 (which defines the opening o2), and the optical module 26.

The optical module 25 may include a lens 254 and an optical element 153.

The optical module 26 may include a diffuser 263.

The lens 254 may include a lens. The lens 254 may include a converging lens. The lens 254 may include an array of micro-converging lens. The lens 254 may include plastic, glass, a mixture of plastic and glass, or the like.

The lens 254 is disposed on the lid 14. The lens 254 is disposed over the opening o1 of the lid 14. The lens 254 is attached or bonded to the lid 14 by the bonding material b254. The bonding material b254 is similar to the bonding material b14. In some embodiments, the bonding material b254 is the same as the bonding material b14. In some other embodiments, the bonding material b254 is different from the bonding material b14. Light beams which pass through the opening o1 may be converged by the lens 254.

The diffuser 263 is different from the diffuser 162 as described and illustrated with reference to FIG. 1A. The diffuser 263 is same or similar to the diffuser 162 as described and illustrated with reference to FIG. 1A. For example, the diffuser 263 may have a thickness which is different from the diffuser 162 as described and illustrated with reference to FIG. 1A. For example, the diffuser 263 may have a thickness which is same or similar to the diffuser 162 as described and illustrated with reference to FIG. 1A. An upper surface of the optical module 25 is substantially and elevationally the same as an upper surface of the diffuser 263. An upper surface of the optical module 25 is elevationally different from an upper surface of the diffuser 263.

The diffuser 263 is disposed on the lid 14. The diffuser 263 is disposed over the opening o2 of the lid 14. The diffuser 263 is attached or bonded to the lid 14 by the bonding material b263. The bonding material b263 is similar to the bonding material b14. The bonding material b263 is the same as the bonding material b14. The bonding material b263 is different from the bonding material b14.

The optical module 27 is similar to the optical module 17. The optical module 27 may function as a dot projector. For example, when light beams emitted from the emitter 12 are reflected or deflected by the MEMS device 13, the light beams reflected or deflected by the MEMS device 13, which arrive at or reach the reflective component 111 or the layer 111s, are reflected by the reflective component 111 or layer 111s to pass through the opening o1; the light beams which pass through the opening o1 may then pass through the lens 254; the light beams which pass through the lens 254 may be converged and then enter and pass through the optical element 153 to form a number of light dots or a light pattern.

The optical module 28 is similar to the optical module 18. The optical module 28 may function as a flood illuminator. For example, when light beams emitted from the emitter 12 are reflected or deflected by the MEMS device 13, the light beams reflected or deflected by the MEMS device 13, which arrive at or reach the reflective component 112 or the layer 112s, are reflected by the reflective component 112 or the layer 112s to pass through the opening o2; the light beams which pass through the opening o2 may then pass through the diffuser 263; the light beams which pass through the diffuser 263 are diffused, spread out or scattered by the diffuser 263.

Figure 2B:
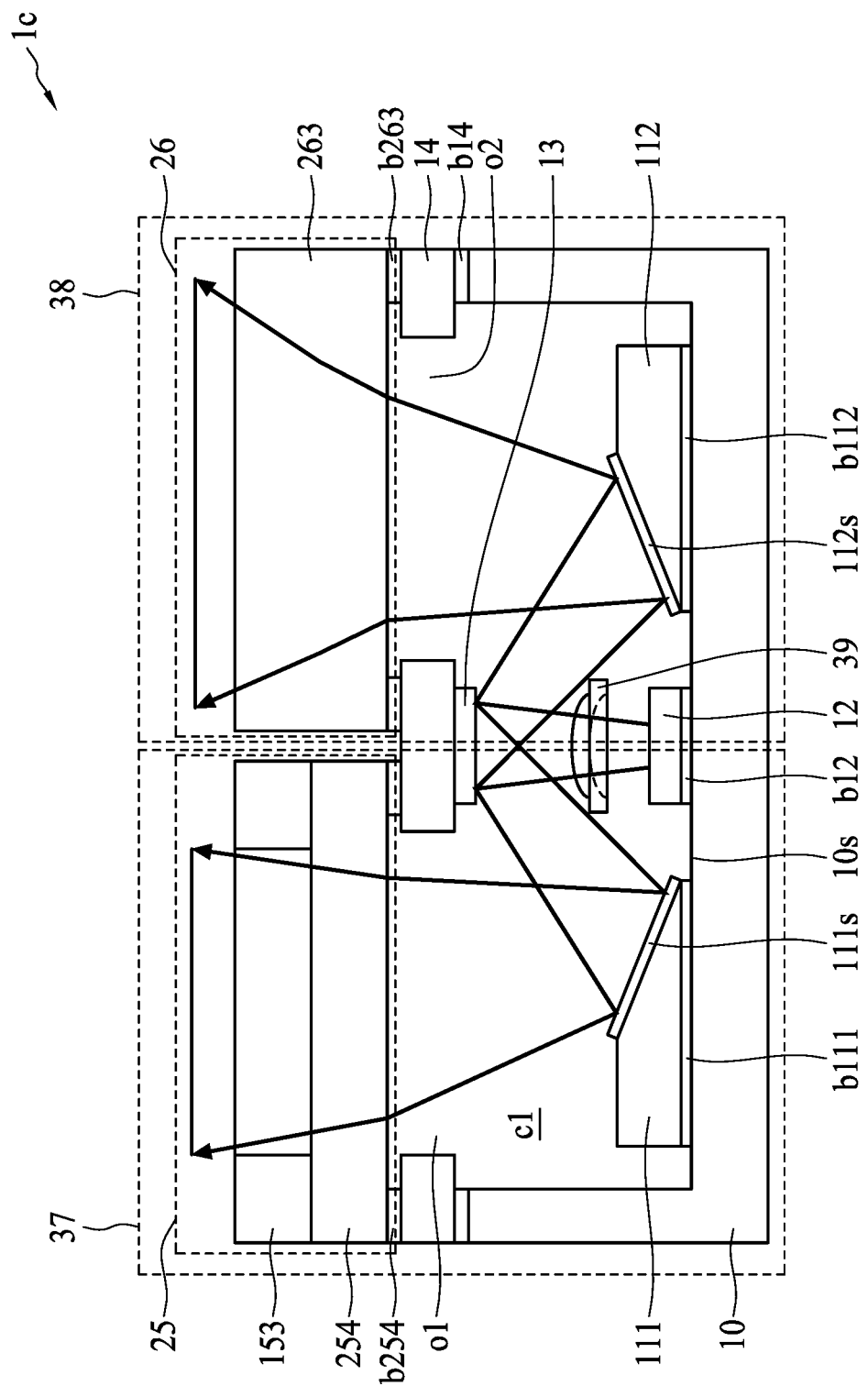
FIG. 2B illustrates a cross-sectional view of a semiconductor device package in accordance with some embodiments of the subject application.

FIG. 2B illustrates a cross-sectional view of the semiconductor device package 1c in accordance with some embodiments of the subject application. The semiconductor device package 1c is similar to the semiconductor device package 1b except that the semiconductor device package 1c further includes a lens 39, the optical module 27 of the semiconductor device package 1b is replaced by the optical module 37, and the optical module 28 of the semiconductor device package 1b is replaced by the optical module 38. The optical module 37 includes the lens 39. The optical module 38 includes the lens 39.

In some embodiments, the lens 39 is disposed on the emitter 12. In some embodiments, the lens 39 is disposed over the emitter 12. In some embodiments, the lens 39 is disposed under the MEMS device 13. In some embodiments, the lens 39 is disposed below the MEMS device 13. In some embodiments, the lens 39 is disposed between the emitter 12 and the MEMS device 13. In some embodiments, the lens 39 is disposed on a light path between the emitter 12 and the MEMS device 13.

Light beams which are directed to the MEMS device 13 from the emitter 12 may pass through the lens 39. Light beams from the emitter 12 to the MEMS device 13 are converged by the lens 39, which may reduce thickness of the lens 254.

Although not illustrated, it is contemplated that the lens 39 may also be introduced in the semiconductor device package 1a as described and illustrated with reference to FIG. 1A.

Figure 3A:
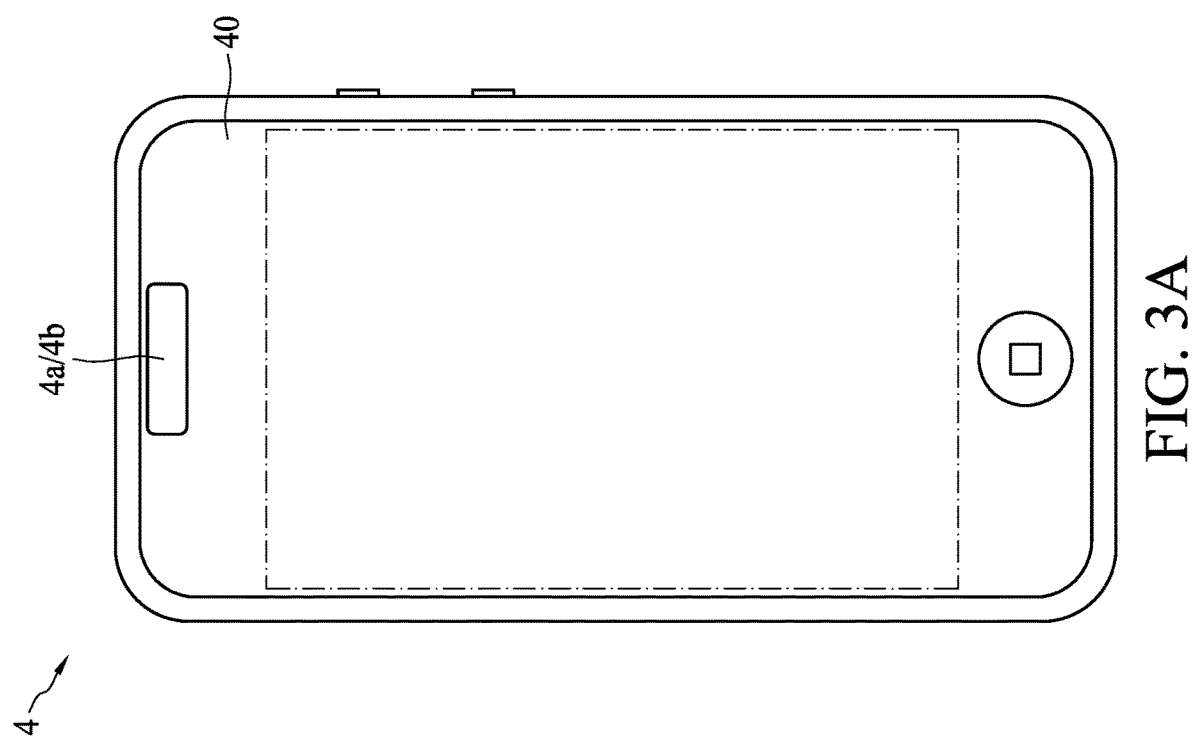
FIG. 3A illustrates an electronic device in accordance with some embodiments of the subject application.

FIG. 3A illustrates an electronic device 4 in accordance with some embodiments of the subject application. The electronic device 4 may include a mobile device, e.g. a mobile phone, a smart phone, a laptop, a tablet, or the like. The electronic device 4 includes a screen 40 and a biometric security-based module 4a. Although not illustrated, it is contemplated that the electronic device 4 may be, for example, a computer, a facility, or a system.

The screen 40 may include a display screen, a touchscreen, a touch panel, or the like.

Figure 3B:
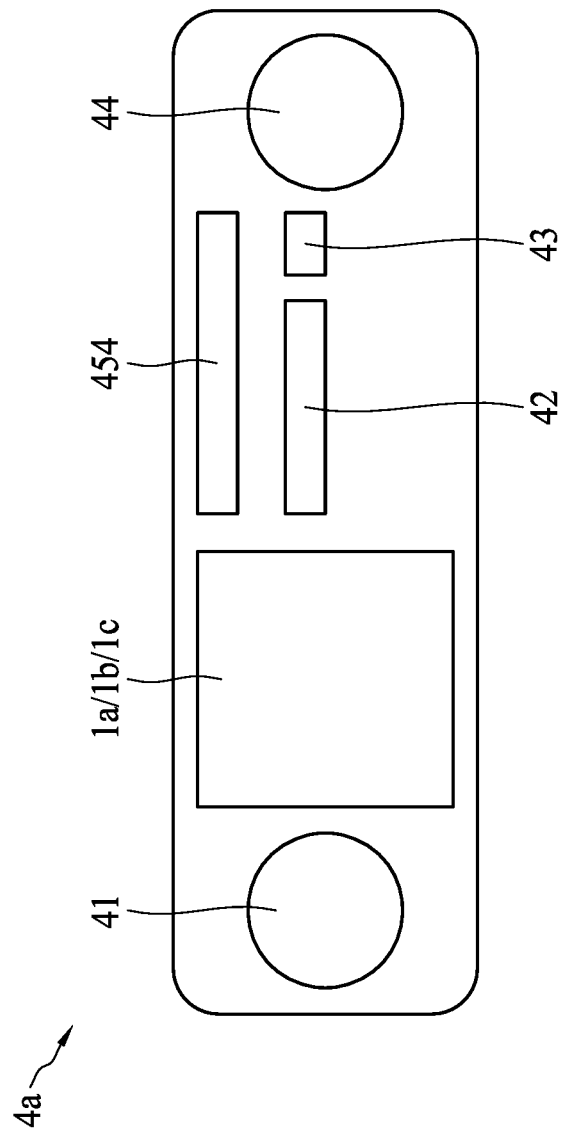
FIG. 3B illustrates a biometric security-based module in accordance with some embodiments of the subject application.

FIG. 3B illustrates the biometric security-based module 4a in accordance with some embodiments of the subject application. The biometric security-based module 4a includes a semiconductor device package 1a/1b/1c, a camera 41, a speaker 42, a microphone 43, an ambient light sensor (ALS) package 454 and another camera 44. It is contemplated that the arrangement of cameras 41 and 44, the semiconductor device package 1a/1b/1c, the speaker 42, the microphone 43, and the ALS package 454 can be varied or changed. The biometric security-based module 4a may include a facial recognition module.

The camera 41 may include a sensor for detecting invisible light or light beams. For example, the camera 41 may include an IR sensor, a UV sensor, or the like. The camera 41 may have a frame rate from approximately 30 to approximately 60 frames per second (fps).

The camera 44 may include a sensor for detecting visible light or light beams. It is contemplated that the camera 44, the speaker 42 or the microphone 43 can be omitted or eliminated in accordance with some other embodiments of the subject application.

Figure 3C:
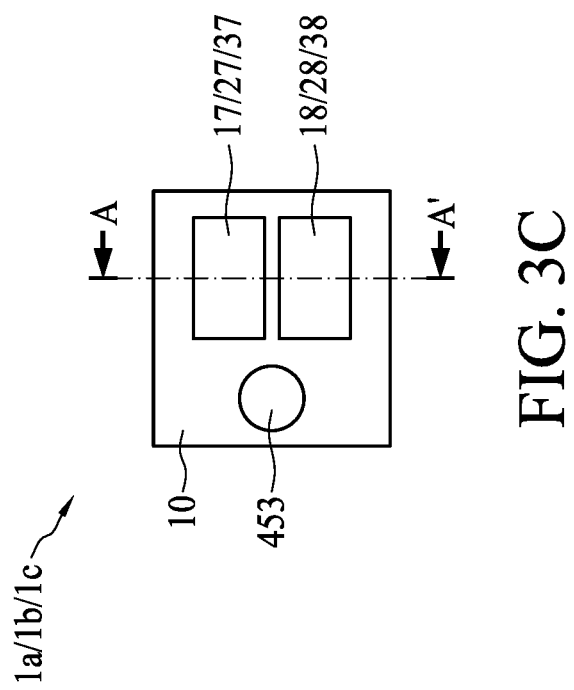
FIG. 3C illustrates a layout or top view of a semiconductor device package in accordance with some embodiments of the subject application.
Figure 4B:
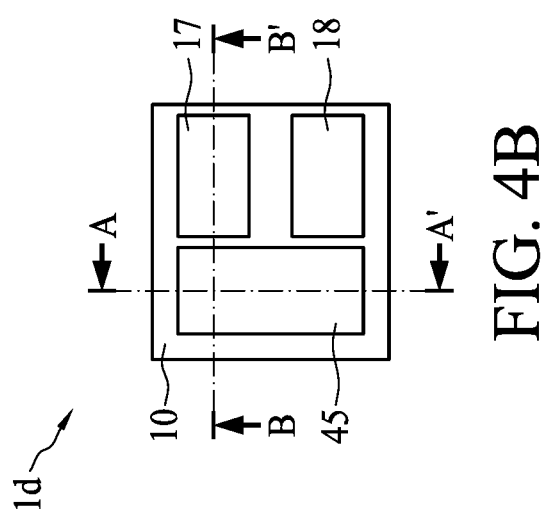
FIG. 4B illustrates a layout or a top view of a semiconductor device package in accordance with some embodiments of the subject application.

FIG. 3C illustrates a layout or top view of the semiconductor device package 1a/1b/1c in accordance with some embodiments of the subject application. The semiconductor device package 1a/1b/1c may include a carrier 10, a proximity sensor (PS) die 453 or a proximity sensor (PS) package 453, an optical module 17/27/37 and another module 18/28/38. It is contemplated that the proximity sensor (PS) die 453 or proximity sensor (PS) package 453 may be eliminated in accordance with some other embodiments of the subject application. It is contemplated that the proximity sensor (PS) die 453 or proximity sensor (PS) package 453 may be eliminated and the ALS package 454 (as shown in FIG. 4B) may be integrated into the semiconductor device package 1a/1b/1c in accordance with some other embodiments of the subject application.

The cross-sectional view along a line AA' is illustrated and described with reference to FIG. 1A. The cross-sectional view along a line AA' is illustrated and described with reference to FIG. 2A. The cross-sectional view along a line AA' is illustrated and described with reference to FIG. 2B.

The optical module 17/27/37 may include a dot projector module 17/27/37. The optical module 18/28/38 may include a flood illuminator module 18/28/38.

FIG. 4A illustrates a biometric security-based module 4b in accordance with some embodiments of the subject application.

The biometric security-based module 4b includes a camera 41, a semiconductor device package 1d, a speaker 42, a microphone 43, and another camera 44. It is contemplated that the arrangement of cameras 41 and 44, the semiconductor device package 1d, the speaker 42 and the microphone 43 can be varied or changed. The biometric security-based module 4b may include a facial recognition module.

It is contemplated that the speaker 42, the microphone 43 or the camera 44 can be omitted or eliminated in accordance with some other embodiments of the subject application.

FIG. 4B illustrates a layout or a top view of the semiconductor device package 1d in accordance with some embodiments of the subject application. The semiconductor device package 1d is similar to the semiconductor device package 1a as described and illustrated with reference to FIG. 1A, except that in the former, the proximity sensor (PS) die 453 and the ALS package 454 are integrated into an optical module 45. The semiconductor device package 1d may include a carrier 10, an optical module 45, an optical module 17 and another optical module 18.

Figure 4C:
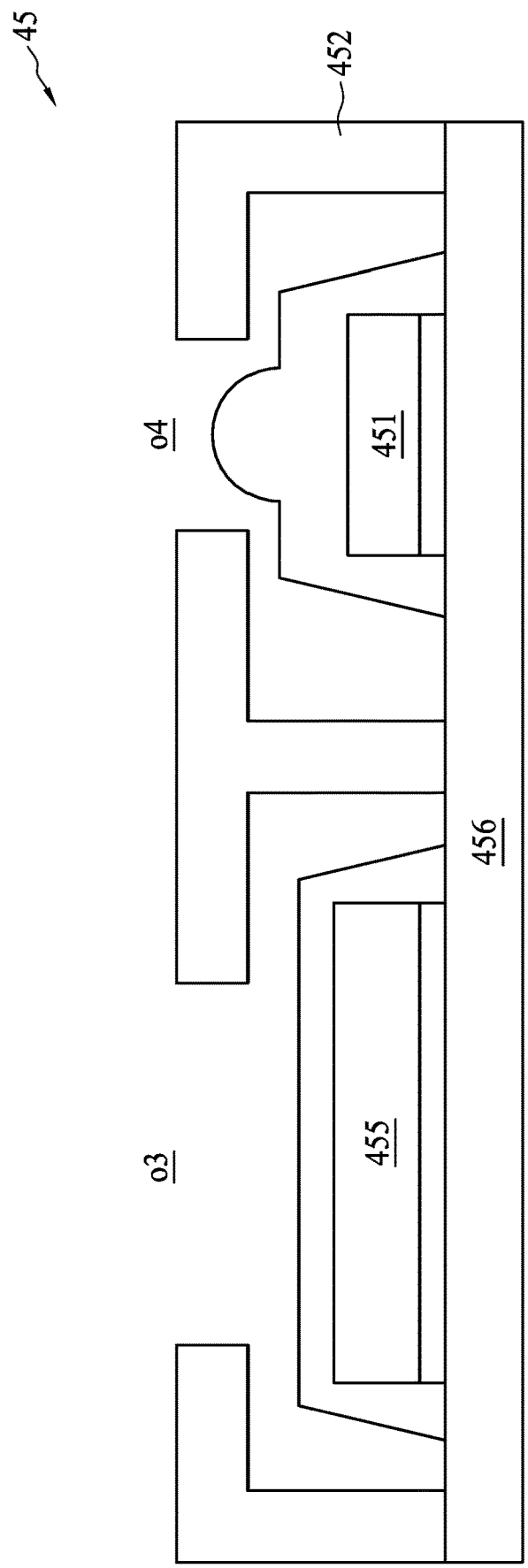
FIG. 4C illustrates a cross-sectional view of an optical module in accordance with some embodiments of the subject application.

FIG. 4C is a cross-sectional view of the optical module 45 across a line AA' as shown in FIG. 4B in accordance with some embodiments of the subject application. The optical module 45 includes semiconductor devices 451 and 455, a lid 452, and a carrier 456.

The carrier 456 may include circuitry therein and/or thereon. The carrier 456 may include conductive traces. The carrier 456 may include conductive pads. The carrier 456 may include conductive vias. The carrier 456 may include semiconductor material. The carrier 456 may include conductive material. The carrier 456 may include insulation material (e.g. dielectric material). The carrier 456 may include redistribution layer(s) (RDL(s)). The carrier 456 may include a redistribution structure. The carrier 456 may include BT, FR4, prepreg (PP) or other suitable substrate materials.

The semiconductor device 451 may be identical or similar to the emitter 12 as described and illustrated with reference to FIG. 1A.

The semiconductor device 455 may include a sensor die, e.g. a photo detector die, a proximity sensor (PS) die, an ambient light sensor (ALS) die or a combo die in which the aforesaid functions are integrated.

The lid 452 may include opaque material. The lid 452 may include plastic material, polymer, resin, metal, metal alloy or other suitable materials. The lid 452 is disposed on the carrier 456. The lid 452 has openings o3 and o4. The opening o3 is aligned with the semiconductor device 455. The opening o3 is on the semiconductor device 455. Light beams or rays may pass through the opening o3 and arrive at the semiconductor device 455. The opening o4 is aligned with the semiconductor device 451. The opening o4 is on the semiconductor device 451. Light beams or rays emitted from the semiconductor device 451 may pass through the opening o4. The lid 452 may include a wall (not denoted in FIG. 4C) between the semiconductor device 451 and the semiconductor device 455 to prevent light beams or rays emitted from the semiconductor device 451 from directly arriving at the semiconductor device 455.

Figure 4D:
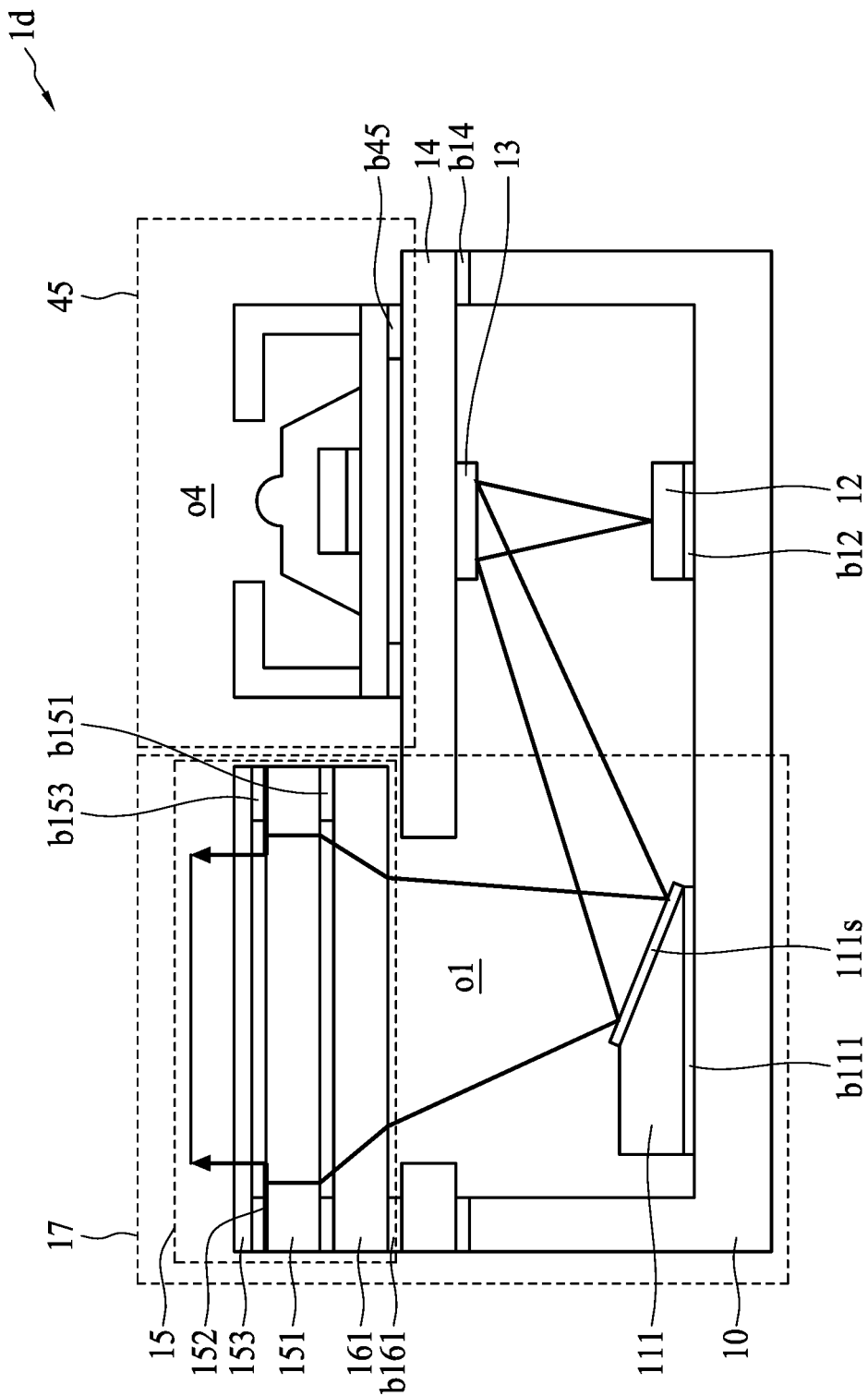
FIG. 4D illustrates a cross-sectional view of a semiconductor device package in accordance with some embodiments of the subject application.

FIG. 4D illustrates a cross-sectional view of the semiconductor device package 1d across a line BB' as shown in FIG. 4B in accordance with some embodiments of the subject application. The semiconductor device package 1d is similar to the semiconductor device package 1a as described and illustrated with reference to FIG. 1A, except that the optical module 45 as described and illustrated with reference to FIG. 4C is integrated into the semiconductor device package 1a to form the semiconductor device package 1d.

The optical module 45 is bonded to the lid 14 by the connection element b45. The optical module 45 is electrically connected to the lid 14. The connection elements b45 may include solder material, conductive adhesive material, or the like for external connection.

Although not illustrated, it is contemplated that the optical module 45 as described and illustrated with reference to FIG. 4C may also be integrated into the semiconductor device package 1b as described and illustrated with reference to FIG. 2A. Furthermore, although not illustrated, it is contemplated that the optical module 45 as described and illustrated with reference to FIG. 4C may also be integrated into the semiconductor device package 1c as described and illustrated with reference to FIG. 2B.

The semiconductor device package 1d, which incorporates the optical module 45, may have a relatively small size. The structure of the semiconductor device package 1d reduces the surface area of the biometric security-based module 4b. The surface area reduction of the biometric security-based module 4b may facilitate the miniaturization of the electronic device 4, saving more display/function area on the screen 40, or creating more space for circuit design. The semiconductor device package 1d, which includes one light source (e.g. the emitter 12) for facial recognition, may allow for relatively less power and less space.

Figure 5A:
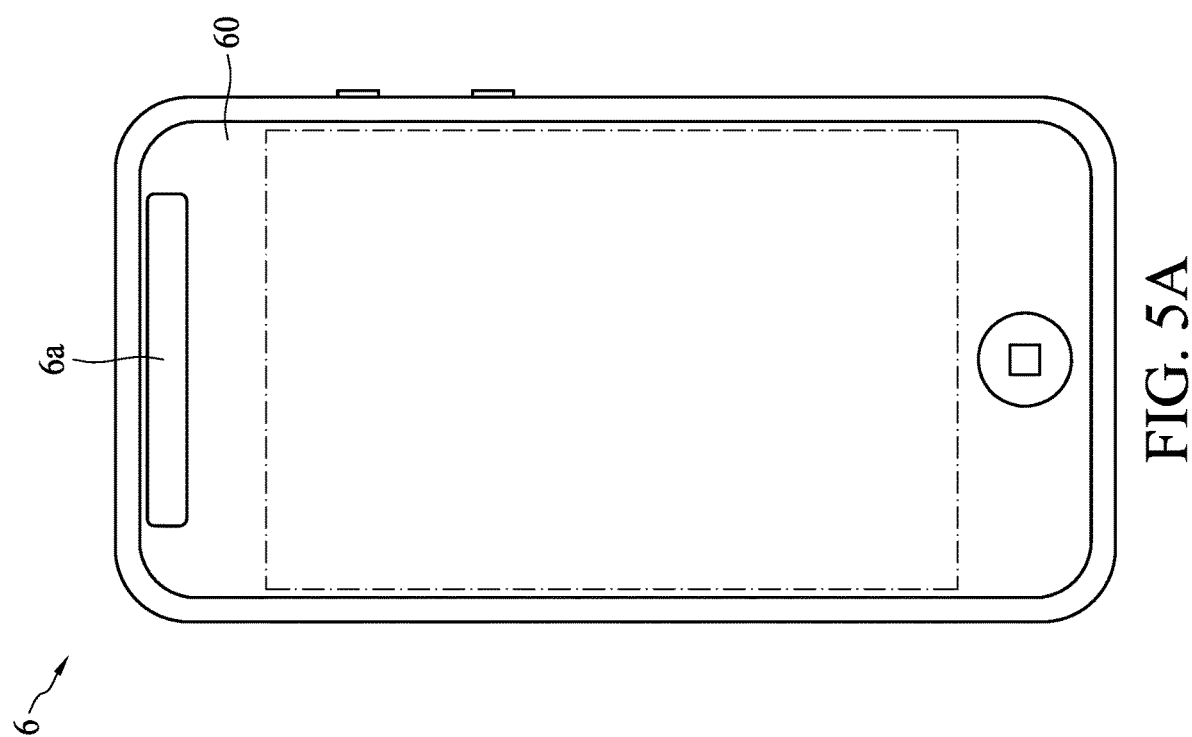
FIG. 5A illustrates an electronic device in accordance with some embodiments of the subject application.

FIG. 5A illustrates an electronic device 6 in accordance with some embodiments of the subject application. The electronic device 6 is similar to the electronic device 4 as described and illustrated with reference to FIG. 3A, except that the biometric security-based module 4a/4b of the electronic device 4 is replaced by a biometric security-based module 6a.

Figure 5B:
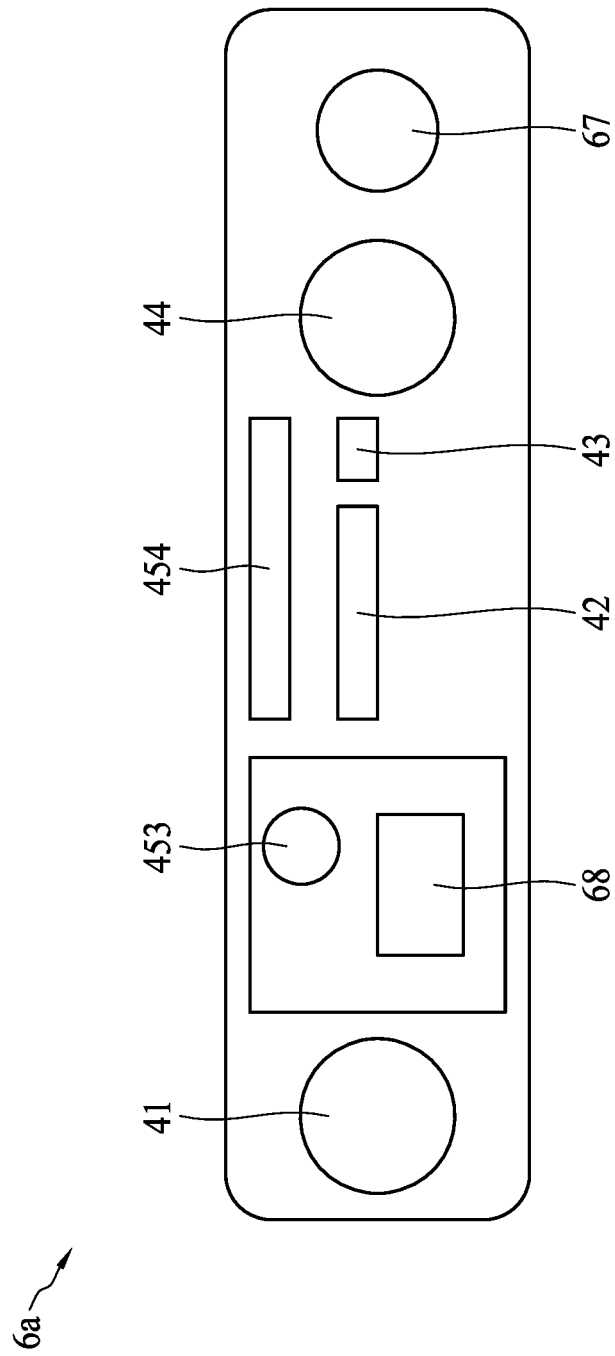
FIG. 5B illustrates a biometric security-based module in accordance with some embodiments of the subject application.

FIG. 5B illustrates a biometric security-based module 6a in accordance with some embodiments of the subject application. The biometric security-based module 6a includes a camera 41, a speaker 42, a microphone 43, another camera 44, an ambient light sensor, a proximity sensor (PS) 453 (or a proximity sensor (PS) package 453), an ambient light sensor (ALS) package 454, a dot projector 67 and a flood illuminator 68. The dot projector 67 is a single/individual/separated package. The dot projector 67 includes a light source. The flood illuminator 68 is a single/individual/separated package. The flood illuminator 68 includes a light source.

The biometric security-based module 6a has a relatively greater surface area compared to the biometric security-based modules 4a and 4b. The biometric security-based module 6a may consume relatively more power compared to the biometric security-based module 4a or 4b, because each of the flood illuminator 68 and the dot projector 67 includes a single light source.

The dot projector 67 may use total internal reflection to achieve light dots projection, which involves a sophisticated design and an accurate assembly. Certain events (e.g. dislocation/displacement of the parts/components due to a drop or collision of the electronic device 6) may lead to the malfunctioning of the biometric security-based module 6a.

In summary for some embodiments, the subject application provides a semiconductor device package including a flood illuminator and a dot projector. The surface area (or occupied area) and power consumption of the semiconductor device package are smaller compared to those of comparative semiconductor device packages. If the semiconductor device package of the subject application is used in an electronic device, the surface or occupied area reduction of the biometric security-based module may facilitate miniaturization of the electronic device, saving more display/function area on the screen, or creating more space for circuit design.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be planar or substantially planar if a displacement of the surface relative to a flat plane between any two points on the surface is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Spatial descriptions, such as "above," "below," "up," "left," "right," "down," "top," "bottom," "vertical," "horizontal," "side," "higher," "lower," "upper," "over," "under," "downward," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of the subject application are not deviated from by such arrangement While the subject application has been described and illustrated with reference to specific embodiments thereof, these descriptions and illustrations do not limit the subject application. It can be clearly understood by those skilled in the art that various changes may be made, and equivalent components may be substituted within the embodiments without departing from the true spirit and scope of the subject application as defined by the appended claims. The illustrations may not necessarily be drawn to scale. There may be distinctions between the artistic renditions in the subject application and the actual apparatus, due to variables in manufacturing processes and such. There may be other embodiments of the subject application which are not specifically illustrated. The specification and drawings are to be regarded as illustrative rather than restrictive. Modifications may be made to adapt a particular situation, material, composition of matter, method, or process to the objective, spirit and scope of the subject application. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the subject application. Therefore, unless specifically indicated herein, the order and grouping of the operations are not limitations of the subject application.

What is claimed is:

1. A semiconductor device package, comprising:
a carrier having a first surface;
a first reflective element disposed on the first surface of the carrier;
a second reflective element disposed on the first surface of the carrier;
a first optical component disposed on the first reflective element;
a second optical component disposed on the second reflective element; and
a microelectromechanical system (MEMS) device disposed over the first surface of the carrier to provide light beams to the first reflective element and the second reflective element,
wherein the light beams provided to the first reflective element are reflected to the first optical component and the light beams provided to the second reflective element are reflected to the second optical component.

2. The semiconductor device package of claim 1, wherein the MEMS device is a MEMS mirror to direct the light beams to the first reflective element and the second reflective element.

3. The semiconductor device package of claim 1, further comprising an emitter disposed on the first surface of the carrier and under the MEMS device, and the emitter emits the light beams toward the MEMS device.

4. The semiconductor device package of claim 1, further comprising a lid disposed on the carrier, the lid having a first opening and a second opening.

5. The semiconductor device package of claim 4, wherein the carrier and the lid define a cavity to receive the MEMS device, the first reflective element and the second reflective element.

6. The semiconductor device package of claim 4, wherein the first optical component is disposed on the first opening of the lid and the second optical component is disposed on the second opening of the lid.

7. The semiconductor device package of claim 4, wherein the MEMS device is disposed under the lid and between the first opening and the second opening of the lid.

8. The semiconductor device package of claim 4, wherein the lid comprises a patterned conductive layer.

9. The semiconductor device package of claim 1 wherein the first optical component comprises a diffractive optical element.

10. The semiconductor device package of claim 9, wherein the emitter comprises a plurality of patterned light sources.

11. The semiconductor device package of claim 9, further comprising a patterned mask disposed between the emitter and the MEMS device.

12. The semiconductor device package of claim 1, further comprising a lens between the emitter and the MEMS device.

13. The semiconductor device package of claim 1, wherein the first optical component further comprises a collimator.

14. The semiconductor device package of claim 13, wherein the collimator is a patterned collimator.

15. The semiconductor device package of claim 1, wherein the first optical component comprises a first diffuser.

16. The semiconductor device package of claim 15, wherein the first diffuser of the first optical component is electrically connected to the emitter.

17. The semiconductor device package of claim 1, wherein the second optical component comprises a first diffuser.

18. The semiconductor device package of claim 17, wherein the first diffuser of the second optical component is electrically connected to the emitter.

19. The semiconductor device package of claim 1, further comprising a third optical component adjacent to the first optical component and the second optical component.

20. A semiconductor device package, comprising:
a carrier having a first surface;
a three-dimensional structured light component disposed on the carrier;
a non-structured light component disposed on the carrier; and
a microelectromechanical system (MEMS) device disposed over the first surface of the carrier to provide light beams to the three-dimensional structured light component and the non-structured light component,
wherein the MEMS device comprises a MEMS mirror to reflect the light beams to a first reflective element and a second reflective element.

21. The semiconductor device package of claim 20, further comprising an emitter on the first surface of the carrier and under the MEMS device, the emitter emits the light beams toward the MEMS device.

22. The semiconductor device package of claim 20, further comprising a reflective element to reflect the light beams provided from the MEMS device to the three-dimensional structured light component and the non-structured light component.

23. The semiconductor device package of claim 20, wherein the three-dimensional structured light component comprises a dot projector.

24. The semiconductor device package of claim 23, wherein the dot projector comprises a diffractive optical element.

25. The semiconductor device package of claim 24, wherein the dot projector further comprises a collimator.

26. The semiconductor device package of claim 20, wherein the non-structured light component comprises a flood illuminator.

27. The semiconductor device package of claim 20, wherein one of the three-dimensional structured light component and the non-structured light component includes a diffuser.

* * * * *